US005614824A

United States Patent [19]

Dames et al.

[11] Patent Number: 5,614,824

[45] Date of Patent: Mar. 25, 1997

[54] HARMONIC-BASED VERIFIER DEVICE FOR A MAGNETIC SECURITY THREAD HAVING LINEAR AND NON-LINEAR FERROMAGNETIC CHARACTERISTICS

[75] Inventors: Andrew Dames; David Ely; Colin Ager, all of Cambridge, United Kingdom

[73] Assignee: Crane & Co., Inc., Dalton, Mass.

[21] Appl. No.: 441,533

[22] Filed: May 15, 1995

[51] Int. Cl.$^{6}$ .......................... G01N 27/72; G01R 33/12; G08B 13/24; G06K 7/08

[52] U.S. Cl. .......................... 324/239; 235/449; 209/534; 194/318

[58] Field of Search ............................ 324/233, 239–243; 194/318–320, 213; 234/449, 493; 209/534, 567–571

[56] References Cited

U.S. PATENT DOCUMENTS

| | | | |
|---|---|---|---|
| 3,292,080 | 12/1966 | Trikilis . | |
| 3,665,449 | 5/1972 | Elder et al. . | |
| 3,747,086 | 7/1973 | Peterson . | |
| 3,790,945 | 2/1974 | Fearon . | |
| 3,870,629 | 3/1975 | Carter et al. . | |
| 4,074,249 | 2/1978 | Minasy . | |
| 4,536,209 | 8/1985 | Ishida | 324/239 |
| 5,005,001 | 4/1991 | Cordery . | |
| 5,096,038 | 3/1992 | Potter et al. | 205/534 |
| 5,151,607 | 9/1992 | Crane et al. . | |
| 5,175,419 | 12/1992 | Yamashita | 235/449 |

FOREIGN PATENT DOCUMENTS

| | | |
|---|---|---|
| 0204574 | 12/1986 | European Pat. Off. . |
| 0295229 | 12/1988 | European Pat. Off. . |
| 0295028 | 12/1988 | European Pat. Off. . |
| 0319524 | 6/1989 | European Pat. Off. . |
| 0352513 | 1/1990 | European Pat. Off. . |
| 0413534 | 2/1991 | European Pat. Off. . |
| 0428779 | 5/1991 | European Pat. Off. . |
| 0611164 | 8/1994 | European Pat. Off. . |
| 763681 | 5/1934 | France . |
| 2130414 | 5/1984 | United Kingdom . |
| WO8809979 | 12/1988 | WIPO . |
| WO9104549 | 4/1991 | WIPO . |
| WO9110902 | 7/1991 | WIPO . |
| WO9208226 | 5/1992 | WIPO . |

*Primary Examiner*—Walter E. Snow
*Attorney, Agent, or Firm*—Richard H. Kosakowski, Esq.; Holland & Bonzagni, P.C.

[57] ABSTRACT

A security thread for use in a paper-based value document, such as currency or banknote paper, includes a plastic substrate coated with one or more regions of "soft" magnetic material. A device for verifying both the authenticity and the denomination of the document includes a coil that is driven by an alternating current to thereby provide a uniform magnetic field within a predetermined spatial region. As the document passes in proximity to the drive coil, the applied magnetic field saturates the regions of magnetic material on the security thread. The magnetic regions provide a response magnetic field that, because of the saturation of the magnetic regions, is a non-linear response containing a multiple of frequency components, including a component at the fundamental or drive frequency and various harmonic frequency components. A receive coil senses the response magnetic field. A signal processor connected to the receive coil utilizes the response signals at the fundamental frequency and the low-order harmonic frequencies to determine both the type of magnetic material on the security thread and the denomination of the document from the spatial distribution of the magnetic regions on the security thread.

17 Claims, 5 Drawing Sheets

HARMONIC-BASED VERIFIER DEVICE FOR A MAGNETIC SECURITY THREAD HAVING LINEAR AND NON-LINEAR FERROMAGNETIC CHARACTERISTICS

BACKGROUND OF THE INVENTION

This invention relates to security threads for paper-based value documents such as currency and banknote papers, and more particularly to a device for sensing the security thread and for determining the authenticity and denomination of the document therefrom.

There exists a number of different approaches in the prior art for verifying the authenticity of paper-based value documents, such as currency and banknote papers, bank checks, stock certificates, etc. These or other methods may also be used to verify a characteristic of the document, such as the denomination of the currency paper. In this way different features of the same general class of documents may be identified. However, verifying the denomination of the currency paper may also be interpreted to be a verification of the authenticity of the document as well.

All of the known verification approaches rely on the detection and/or measurement of specific physical properties or patterns associated with the documents. Usually, the feature to be detected is deliberately added to the document during document manufacture as part of a document recognition system or an anti-counterfeit document verification system. The device used to ascertain the type of security feature added to the document, as well as to distinguish between various characteristics of the document (as indicated by certain features designed into the type of security feature), is usually designed in conjunction with the physical characteristics of the security feature. This is to provide optimum functionality in document verification.

Common approaches include the usage of magnetic ink printed at predetermined locations and in predetermined patterns on a surface of the paper. Another approach is to embed into the currency paper, either partially or entirely, a plastic security thread substrate coated with predetermined patterns of conductive and/or magnetic materials. The detector is then designed to sense the type of material and, to a limited extent, the spatial distribution of the material on the thread substrate.

More specifically, prior uses of magnetic materials in the field of document security have strictly involved relatively "hard" (i.e., high magnetic coercivity) magnetic materials. The magnetic material may be formed as part of the ink printed on a surface of the document, may be introduced into the surface of the document in some other form, or may be coated on the plastic substrate of a security thread embedded in the document.

Detection of these relatively hard magnetic materials (and, thus, verification of the authenticity of the document and/or some characteristic thereof) is typically carried out by exposing the material to a magnetic field and then detecting the remanent magnetization. The magnetic field may be applied to the magnetic material either at the time of document manufacture, or by the detection system itself just prior to "reading" or sensing the remanent magnetization; e.g., during a commercial sales transaction or during bank sorting of the currency paper. Examples of relatively hard magnetic materials utilized in the aforementioned applications include magnetic powders, such as ferrites, or thin sheets or ribbons of crystalline magnetic material, such as nickel. (See U.S. Pat. No. 4,183,989.) Patterns of magnetization may be written to the materials, and the patterns can be read with reading heads. The reading heads are capable of reading either direct current (D.C.) magnetization (e.g., Hall-effect sensing), or may utilize a time-varying magnetic field generated by movement of the bill past the read head. In either case, only the net remanent magnetization is measured. This approach requires use of high-strength magnetic fields for pre-magnetization and sensitive read heads for detection. A limitation is that detection of the magnetic material must take place at close proximity (much less than 1 millimeter spacing between the read head and the magnetic material). Examples of this "hard" magnetic material approach to document verification are given in EP 0295229, WO 92/08226, EP 0319524, EP 0204574, EP 0428779, WO 91/04549, GB 2130414, WO 91/10902, EP 0413534 and U.S. Pat. 3,870,629.

In contrast to "hard" magnetic materials and their usage in document security, it is known to use relatively "soft" magnetic materials (i.e., low magnetic coercivity) in the field of electronic article surveillance (e.g., anti-theft detection of items in a retail store environment). Compared to hard magnetic materials, the soft magnetic materials are easily magnetizable from a distance by a relatively weak applied magnetic field. A typical application includes the retail article having a "tag" or "marker" comprised of the soft (e.g., ferromagnetic) material attached thereto. If the article is legitimately purchased, the clerk at the retail store either removes the article or causes a change in the marker's magnetic characteristics. However, if the article is attempted to be stolen, an interrogating magnetic field applied to the exit area of the retail store strikes the marker, which then gives off or emits characteristic, recognizable signals. These signals may be utilized to sound an alarm to alert store personnel as to the attempted occurrence of a theft.

These prior art surveillance applications have involved the detection of a tagged object at essentially unconstrained position or orientation within a relatively large volume of space. A soft magnetic material comprising the marker is of high magnetic permeability; thus, it is easily saturated by a time-varying alternating current (A.C.) applied magnetic field. The saturated magnetic material yields non-linear response magnetic fields containing harmonic frequencies of the applied field frequency.

A problem with the known electronic surveillance systems arises due to the requirement that it interrogate a large space. Common magnetic objects, such as keys, differ from the magnetic markers in that they have a lower magnetic permeability. Thus, the common objects emit relatively fewer harmonic signals (at lower frequencies) than a high permeability object does. Therefore, to properly distinguish high permeability, soft magnetic material (the article marker) from low permeability, soft magnetic material (the house key), higher order harmonics must be sensed and processed by the electronic article surveillance system. However, a problem is that much less signal energy is inherently present in higher-order harmonics than in lower-order harmonics. Thus, the detection system necessarily tends to be relatively complex.

Additionally, to achieve a multiplicity of distinctly recognizable objects, a limited number of electronic article surveillance systems incorporate several discrete magnetic elements. Each element yields a slightly different response to the relatively uniform (spatially) interrogation and reading fields of the detector system. In this way, when a quasi-uniform interrogation field is applied to a tag or marker, the multiplicity of characteristics of the response magnetic field can be decoded to indicate tag identity. The separable characteristic can be identified as frequency, or as magnetic intensity switch-on threshold. No known attempt has been made in the prior art to gain spatially-resolved data from the anti-theft features by high resolution "reading" methods. This is because anti-theft applications require a detector coil of characteristic dimensions much larger than the size of the recognized feature (i.e., the tag).

Examples of prior art electronic article surveillance systems and its components are described and illustrated in EP 0295028, WO 88/09979, EP 0611164, EP 0352513, French Patent Specification 763681, and U.S. Pat. Nos. 3,665,449, 3,747,086, 3,790,945, 3,292,080, 4,074,249 and 5,005,001.

Accordingly, it is a primary object of the present invention to verify the authenticity and/or denomination of a. paper-based value document, such as currency or banknote paper, having an embedded security thread with magnetic features.

It is a general object of the present invention to interrogate the security thread with the magnetic field signal and to determine the authenticity and/or denomination of the paper from the magnetic response signal emitted from the thread.

It is another object of the present invention to provide a security thread with one or more regions of "soft" magnetic material, the thread typically being embedded entirely in a paper-based value document, and to provide a device that both verifies that the magnetic thread material is of a predetermined type and senses the spatial distribution of the magnetic material to determine a characteristic, such as the denomination, of the document.

It is another object of the present invention to provide a non-contact verifier device for sensing the type and distribution of magnetic material on a security thread utilizing an interrogating magnetic field.

It is yet another object of the present invention to impose an alternating current magnetic field from a non-contacting source onto a security thread coated with soft magnetic material in predetermined patterns, and to sense the magnetic field re-emitted by the security thread and determine, from the sensed field, one or more characteristics of a document in which the security thread is embedded.

The above and other objects and advantages of this invention will become more readily apparent when the following description is read in conjunction with the accompanying drawings.

SUMMARY OF THE INVENTION

To overcome the deficiencies of the prior art and to achieve the objects listed above, the Applicants have invented a device for verifying both the authenticity and denomination of currency paper having a security thread with magnetic materials integrally formed therewith. Preferably, the security thread comprises a thin rectangular plastic substrate embedded entirely within the paper. One or both opposing surfaces of the substrate may have a soft (i.e., easily magnetizable) magnetic material disposed thereon in predetermined spatial distribution patterns indicative of, e.g., denomination of the currency paper. The different denominations of currency paper may be indicated by different spatial distribution patterns of the magnetic material.

According to a first aspect of the present invention, the type of soft magnetic material used with the security thread is determined by passing the currency paper with the security thread embedded therein in non-contacting proximity to a wire coil that is connected with an alternating current signal at a predetermined frequency. The drive coil creates an alternating current magnetic drive field that, because of the drive coil size and position, is highly uniform. The field strength of the drive magnetic field is sufficient to saturate the magnetic material on the security thread. The response magnetic field generated by the magnetic material is non-linear, resulting in the inclusion of harmonic frequency components. A sensing coil detects the response magnetic field and converts the various frequency components to electrical signals. These signals are demodulated and the in-phase and quadrature (i.e., 90° phase shift) amplitude components of both the linear or fundamental signal (i.e., the component of the response signal at the same frequency of the drive signal), and the third harmonic of the fundamental signal are examined to determine the type of material. For example, for certain types of soft magnetic materials under particular conditions of magnetic excitation, it is known that the amplitude of the third harmonic signal must be above a certain threshold, while at the same time the amplitude of the fundamental signal must be below a certain, yet different, threshold level. Also, the ratio of the amplitude of the third harmonic and the fundamental must lie in a certain range. The thresholds and range are known and are unique to each different type of soft magnetic material.

According to a second aspect of the present invention, the sensing coil utilized in the first aspect of the present invention is in non-uniform spatial orientation (i.e., highly localized) with respect to the thread. Such high degree of localization is achieved by requiring at least one dimension of the coil to be much smaller than the overall length of the security thread, and preferably smaller than the length of the smallest magnetic thread region. The magnetic drive field is applied at preferably a 45° angle with respect to the height dimension of the security thread (i.e., if any characters are formed in the magnetic material on the security thread, the drive field is at a 45° angle with respect thereto). This angular orientation preferably allows only one magnetic material region on the security thread to be interrogated at a time. This provides for proper resolution for sensing the spatial distribution of the magnetic material regions on the security thread, thereby allowing for a determination of the denomination of the currency paper.

In a similar manner to the first aspect of the present invention, the resulting magnetic field signals re-emitted from the security thread are broken up into the fundamental and third harmonic components, and both the in-phase and quadrature components are examined by a signal processor to determine denomination. One method for determining denomination is to compare a resulting signal indicative of the sensed spatial distribution of magnetic material on the security thread to a plurality of signals stored in memory that are indicative of various valid denomination spatial distribution patterns.

DETAILED DESCRIPTION OF THE PREFERRED EMBODIMENTS

Figure 1:
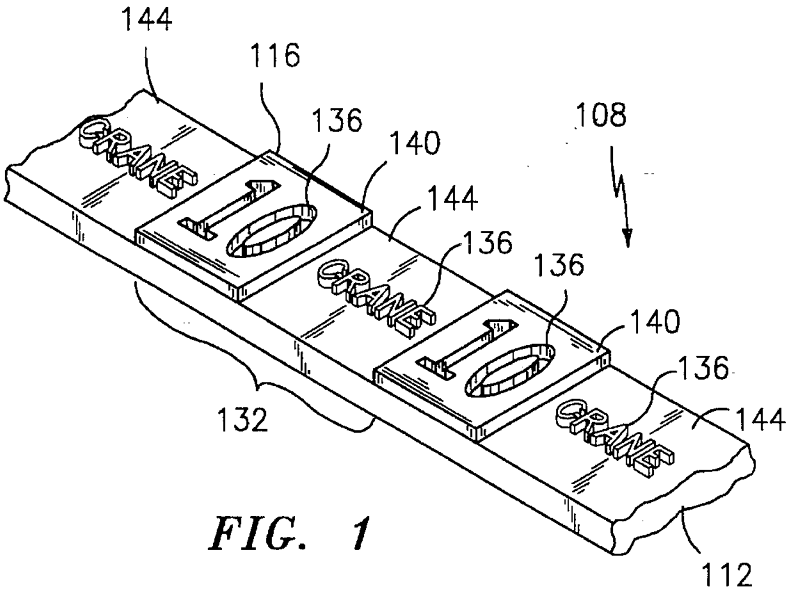
FIG. 1 is a perspective view of a security thread having magnetic material associated therewith and arranged as a security feature within a paper-based value document.

Referring to the drawings in detail, a device for verifying the authenticity and/or a characteristic (e.g., denomination) of a paper-based value document is illustrated therein and generally designated by the reference numeral 100. The device 100 is for use with a document 104, such as currency or banknote paper, that incorporates a security feature in the form of a security thread 108. The thread 108 comprises a plastic substrate 112 embedded entirely within the paper 104. On one surface of the substrate 112 is deposited soft magnetic material 116 in predetermined patterns. In operation, the document 104 with the security thread 108 therein is passed in proximity to a wire coil 120 that has applied thereto an alternating current to thereby create a magnetic field in a predetermined region surrounding the drive coil 120. Disposed in proximity to the drive coil is a receive coil 124 that is connected to processing electronic circuitry 128. As the document 104 with the security thread 108 is passed in proximity to the drive coil 120, the applied magnetic field saturates the soft magnetic material 116 on the security thread substrate 112. The magnetic material on the security thread substrate re-emits a non-linear response field containing various frequency components, one frequency component being at the same frequency as the applied magnetic field, other frequency components being harmonic multiples of the frequency of the applied magnetic field. The receive coil 124 senses the various frequencies of the response magnetic field and provides corresponding electrical signals. These electrical signals are processed by the electronic circuitry 128 in a predetermined manner to ultimately determine both the type of magnetic material 116 and the spatial distribution of the magnetic material 116. In this way, the device 100 can verify the authenticity of the document 104 and also determine a characteristic, such as denomination, of the document.

Figure 2:
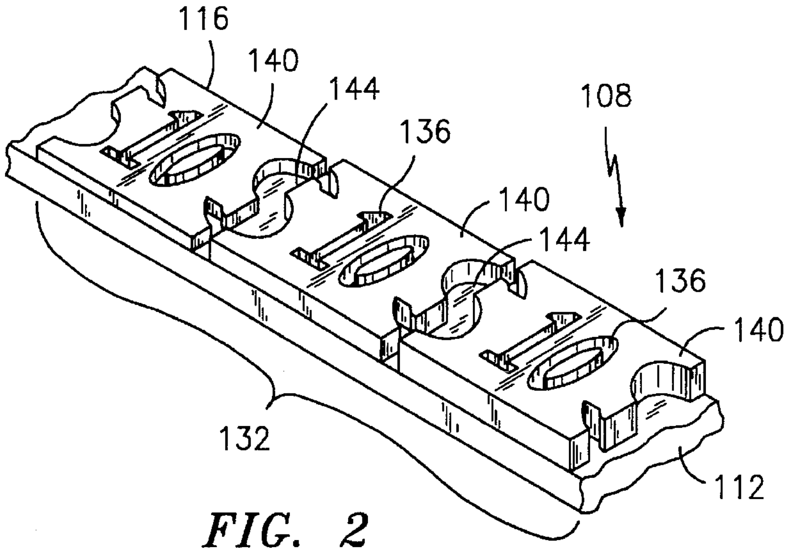
FIG. 2 is a perspective view of an alternative embodiment of the security thread of FIG. 1.
Figure 3:
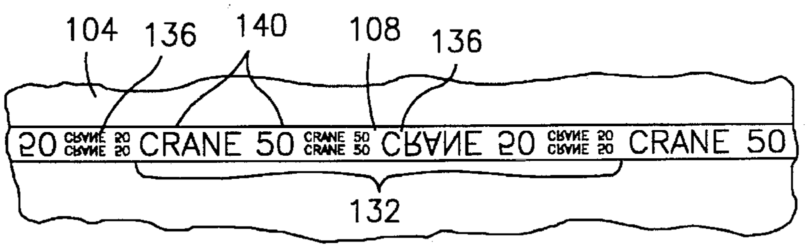
FIG. 3 is a plan view of another alternative embodiment of the security thread of FIGS. 1 and 2.

Referring to FIGS. 1–3, in a preferred embodiment the security thread 108 comprises a plastic substrate 112 having at least one security feature that employs a soft magnetic metal located on at least one surface of the substrate. However, it is to be understood that this preferred embodiment of the security thread is strictly exemplary. Instead, the security feature associated with the document may comprise, if desired, a planchette or platelet, or the like. Regardless of the actual type of security feature chosen, a common characteristic of each feature is the type and spatial distribution of magnetic material 116. In the case of a security thread 108, the plastic substrate 112 merely comprises the "vehicle" for carrying the magnetic material 116.

Preferred embodiments of the security thread 108 comprise a plastic substrate 112 having two security features: a first security feature comprising an optionally repeating pattern 132 of soft magnetic metal; a second security feature comprising magnetic and/or non-magnetic metal-formed indicia 136. The optionally repeating pattern 132 of the first security feature comprises at least one soft magnetic metal region 140, and at least one partitioning region 144, where such regions are optionally in alternating sequence in a pattern 132 which extends along the length of the plastic substrate 112. Partitioning region(s) 144 allow the metal regions 140 to act quasi-independently from each other magnetically when the security thread 108 is subject to a magnetic field interrogation scheme, described in detail hereinafter in accordance with the device 100 of the present invention. That is, the detectable characteristics of the partitioning region, if any, do not interfere with the detectable difference of the signals generated by the metal regions 140.

The magnetic metal materials 116 contemplated for use with the security thread 108 are soft magnetic metals having low coercivities of less than about 5000 amperes/meter (A/m), when measured by an alternating current magnetometer at frequencies of from about 10 kilohertz (kHz) to about 100 kHz. Preferred soft magnetic metals have coercivities of between about 50 A/m and about 5000 A/m, and more preferably between about 100 A/m and about 2000 A/m. These preferred soft magnetic metals demonstrate toughness and resilience to mechanical deformation. They also have a high intrinsic relative permeability of from about 200 to about 100,000. The metals saturate at low magnetic fields of below about 10,000 A/m, and have a degree of magnetic non-linearity that is sufficiently high to give measurable harmonic signals during mid-range (i.e., 1 to 2 mm) examination of magnetic properties with an imposed magnetic field.

Preferred soft magnetic metals include amorphous metal glass materials such as amorphous alloy soft magnetic metals, including cobalt/iron based alloys, iron/nickel based alloys and cobalt/nickel based alloys. Suitable cobalt/iron based alloys are available from Vacuumschmelze GmbH, Postfach 2253, D-63412, Hanau, Germany under the trade designations: Vacuumschmelze 6025 (66% cobalt (Co), 4% iron (Fe), 2% molybdenum (Mo), 16% silicon (Si) and 12% boron (B)); Vacuumschmelze 6030 (similar to Vacuumschmelze 6025, around 70% Co, minor constituents unknown); and Vacuumschmelze 6006 (46% Co, 26% Ni, 4% Fe, 16% Si and 8% B). Suitable iron/nickel based alloy compositions are available from Allied-Signal, Inc., Parsippany, N.J. 07054, under the trade designations: Allied Metglas 2714 and 2704. Such materials give an amorphous structure under certain deposition conditions.

The magnetic metal contemplated for use with the second security feature of the security thread is not restricted and includes both soft and hard magnetic metals. The non-magnetic metals contemplated for use on the thread include aluminum, nickel, and silver, with the preferred metal being aluminum.

In FIG. 1, the pattern 132 of the security thread 108 comprises a magnetic metal region 140 and an adjacent partitioning region 144, with both regions adopting a rectangular configuration. The metal-formed indicia 136 are located in both the magnetic metal region 140 as magnetic metal-formed indicia, and in the partitioning region 144 as metal indicia. In FIG. 2, the pattern 132 comprises three magnetic metal regions 140 of increasing thicknesses to provide regions of differing magnetic intensities, and corresponding partitioning regions 144 therebetween that adopt the configuration of a dollar sign. The partitioning regions 144 are located in and between each magnetic metal region 140. In other words, the metal-formed indicia that adopt the configuration of a dollar sign are co-extensive with partitioning regions 144 and serve to completely separate (in FIG. 2) the metal regions 140. The term co-extensive, as used herein, means that the subject regions 140, 144 and indicia have the same spatial boundaries.

In FIG. 3, the magnetic metal regions 140 of the first security feature and the second security feature are coextensive. For example, the metal-formed indicia of the second security feature are magnetic metal indicia that form the magnetic metal region(s) of the first security feature.

The plastic substrate 112 may be manufactured from any clear or translucent material, that is preferably non-magnetic and non-conductive. Such materials include polyester, regenerated cellulose, polyvinyl chloride, and other plastic film, with the preferred material being polyester. These films remain intact during the papermaking process and preferably have a width ranging from about 0.5 millimeters (mm) to about 3.0 mm.

As described hereinbefore, the optionally repeating pattern 132 of the first security feature comprises at least one soft magnetic metal region 140 and at least one partitioning region 144, optionally in alternating sequence in a pattern 132 which extends along a portion or all of the length of the plastic substrate 112. Other contemplated sequences include blocks of a plurality of magnetic metal regions 140 employing various amounts of magnetic metal and separated by partitioning regions 144. Each metal region 140 comprises varying amounts of magnetic metal material. Where the partitioning regions 144 serve to allow the metal regions 140 to act quasi-independently from each other magnetically, the partitioning regions 144 may take the form of a magnetic metal-free region or may take the form of a region having reduced magnetic metal content or surface coverage as compared to the magnetic metal regions 140. The magnetic metal region(s) 140 and the partitioning region(s) 144 can adopt any shape or configuration.

Where the shape (e.g., size and thickness) of the magnetic metal regions determine the magnetic response therefrom both through the influence of shape-determined permeability effects and through the influence of thickness on magnetic coercivity, it is preferred that each magnetic metal region 140 have a thickness ranging from about 0.01 to about 10 microns, and more preferably have a thickness of from about 0.10 to about 0.50 microns. It is also preferred that each magnetic metal region 140 have a length along the lateral edge of the plastic substrate 112 ranging from about 0.1 mm to about 5 mm. The magnetic metal regions 140 adopting the above-referenced dimensions should render relative shape-determined magnetic permeability values in a preferred range of 200 to 10,000. Such high permeability enables the magnetic metal to be saturated easily in weak magnetic fields. Moreover, saturation that occurs at particular fields provide a further basis for authentication.

The second security feature of the thread 108 can be a separate and/or co-extensive public security feature and comprises magnetic and/or non-magnetic metal-formed indicia 136, such as metal characters or clear characters defined by metal boundaries. In particular, magnetic metal-formed indicia or clear characters can form a part of each magnetic metal region 140 and partitioning region 144, and/or can form partitioning region(s) 144. On the other hand, magnetic metal indicia or magnetic metal characters 136 can form the magnetic metal region(s) 140 and/or a part of each partitioning region 144. Also, non-magnetic metal indicia or non-magnetic metal-formed indicia 136 can form a part of partitioning region(s) 144. In a preferred embodiment, where the security thread 108 is embedded in a security paper 104, the indicia 136 create a term or phrase that is not readily discernable in reflective illumination, but which becomes legible to the viewing public in transmitted illumination. The device 100 of the present invention, described in detail hereinafter, verifies only the first security feature (i.e., the magnetic metal regions) and not the second security feature (i.e., the indicia).

The first and second security features may be formed by depositing magnetic metal material 116 on the plastic substrate 112 by any one of a number of methods including, but not limited to, methods involving selective metallization by electrodeposition, directly hot stamping onto the substrate or using a mask or template in a vacuum metallizer, and methods involving metallization followed by selective demetallization by chemical etching, laser ablation and the like.

Methods involving metallization followed by selective demetallization are preferred. Contemplated metallization or deposition techniques include sputtering, e.g., planar magnetron sputtering, electron beam or thermal evaporation/sublimation, and electrolytic chemical deposition in addition to organometallic vapor pyrolysis. A preferred metallization or deposition technique is sputtering.

Sputtering is a physical vapor deposition process that is carried out in a vacuum chamber, in which ions of gas (e.g., argon), are accelerated across a difference in electrical potential with sufficient force to eject atoms from a target. The ejected atoms travel through a partial vacuum until they collide with a surface (e.g., plastic substrate 112) on which they can condense to form a coating. It is contemplated that the target used in the sputtering process (e.g., an alloy capable of forming an amorphous metal glass) be prepared by plasma spraying from a melt and that the deposited material not be annealed after deposition.

Contemplated selective demetallization techniques are techniques where deposited material is selectively removed from a target surface. As set forth above, these techniques include chemical etching and laser ablation etching. Also included are abrasion and lift-off techniques. Lift-off techniques contemplate the selective removal of deposited material by selective adhesive application followed by removal of the adhesive on a carrier. Chemical etching and laser ablation techniques are preferred.

Chemical etching can be carried out by selective printing of a resist followed by chemical etching using an appropriate etchant such as ferric chloride or a hydrofluoric acid/nitric acid mix.

To achieve the magnetic metal regions 140 of varying thicknesses as shown in FIG. 2, etching techniques that only partially remove the original thickness of the deposited metal may be employed in conjunction with techniques that serve to etch to the full depth of the deposited metal layer(s).

Laser ablation etching can be carried out at reduced laser power, where the soft magnetic metal of the present invention, when heated to temperatures of about 350° to 400° C., crystallizes out of the amorphous state. The resulting morphological disruption typically causes the material to flake and crumble. Accordingly, power requirements are reduced when compared to requirements inherent in the laser etching of vacuum-deposited aluminum.

In addition to the above, it is also possible to use conventional thermal contact print heads, which achieve temperatures of about 350° C. to about 450° C. and resolutions of up to about 300 dots per inch (dpi), to drive recrystallization of the subject material and thereby effect material removal or etching.

The security thread 108 may include additional layers or coatings beyond the magnetic metal. Contemplated additional layers or coatings include plastic protective outer layers that render the thread less susceptible to chemical attacks, and reflective metal layers and camouflage coatings that render the thread less apparent under reflective illumination when the thread is embedded in security papers such as banknotes. Also included are adhesive layers that facilitate the incorporation of the thread into or onto security documents.

Once a composite sheet, containing security features, is prepared as detailed above, the sheet can be slit into security threads using conventional techniques or divided into a large number of planchettes by a suitable die cutting operation.

The security thread 108 may be introduced into security papers 104, such as banknotes, during the manufacture thereof. For example, if the security thread 108 is in the form of a planchette, it may be pressed (optionally with the aid of an adhesive) onto the surface of a partially consolidated paper web, resulting in the surface mounting of such planchettes. On the other hand, the security feature in the form of a security thread 108 comprising substrate 112 coated with magnetic material 116 may be incorporated within wet paper fibers while the fibers are unconsolidated and pliable, as taught by U.S. Pat. No. 4,534,398. This results in the thread 108 being totally embedded in the paper. The thread 108 may also be fed into a cylinder mold papermaking machine, cylinder vat machine, or similar machine of known type, resulting in partial embeddment of thread 108 within the body of the finished paper (i.e., paper with a windowed thread). In addition, the thread 108 may be mounted on the surface of security papers either during or post manufacture.

Figure 4:
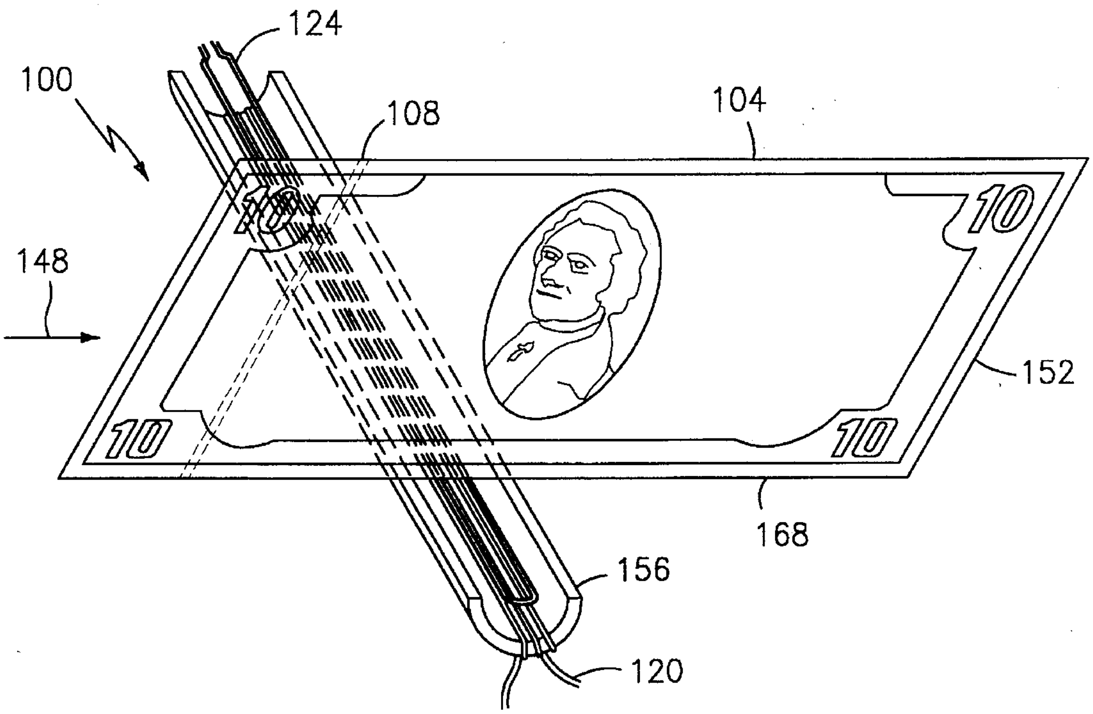
FIG. 4 is a perspective view of a drive coil and a receive coil arranged on a ferrite core, together with a currency paper containing the security thread of FIGS. 1–3 and passing in proximity to the drive and receive coil arrangement.

Referring now to FIG. 4, there illustrated is the currency or banknote paper 104 with the security thread 108 embedded entirely therein, passing in proximity to a drive coil 120 and a receive or detector coil 124 (typically no greater than ten (10) millimeters from the receive coil 124 and, if possible, also the drive coil 120). The arrowhead 148 in FIG. 4 indicates that the currency paper 104 is being scanned in a "narrow-edge" direction with respect to the long dimension of the coils 120, 124 (that is, the shorter edge 152 of the paper 104 is the leading edge in the direction of scanning). The security thread 108 is embedded within the document 104 such that the height dimension of the indicia 136 is coaxial with the feed direction of the paper.

Figure 6:
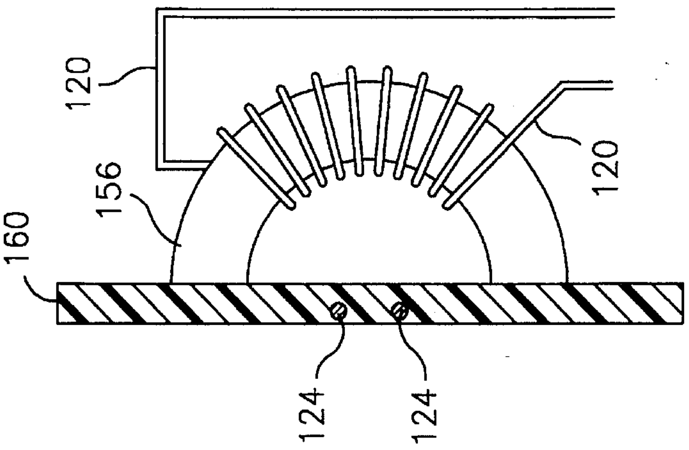
FIG. 6 is an end view of the arrangement of the drive and receive coils of FIGS. 4–5.
Figure 5:
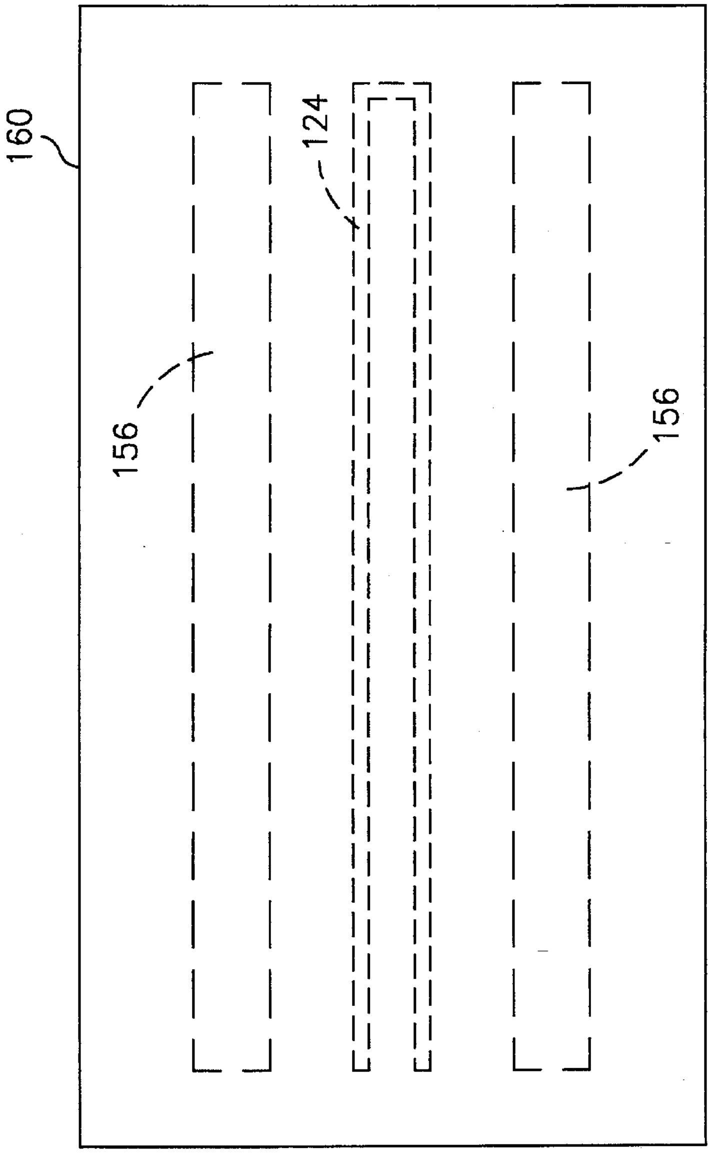
FIG. 5 is a top view of the arrangement of the drive and receive coils of FIG. 4.

The drive coil 120 comprises a first coil of wire wound around a soft-magnetic sintered ferrite core 156. The receive coil 124 is embedded within a piece 160 of insulative material (FIG. 6) and comprises a single coil (i.e., a single winding) of wire. FIGS. 4–6 illustrate the spatial positioning of the two coils 120, 124 with respect to ferrite core 156.

Use of a ferrite core 156 in conjunction with the drive coil 120 allows the applied magnetic field generated by the drive coil to be "launched" at predetermined spatial positions that give good uniformity and strength for the applied magnetic field. The ferrite core 156 also allows the applied magnetic field to be accomplished using relatively smaller electrical currents than those required for air-core coils. Thus, for battery-operated devices, there is a lower power consumption. Also, the use of a ferrite core 156 allows the drive coil windings to be kept away from the area of the interrogating or applied magnetic field (more specifically, kept away from the receive coil windings). This enables a reduction of stray capacitive coupling between the drive and receive electrical circuits described hereinafter. Also, capacitive coupling is reduced if the number of windings in the receive coil 124 is kept relatively low. The preferred embodiment utilizes only a single coil winding. Alternatively, more than one receive coil 124 may be utilized.

The drive coil 120 and receive coil 124 arrangement of FIGS. 4–6 is illustrated as being disposed on only one side of the proffered currency paper 104. It should be understood that this arrangement is purely exemplary. Single-sided application and detection may be necessary where ergonomic or feed-constraint or space-constraint considerations override the potential advantages of a double-sided arrangement of coils 120, 124. Instead, a double-sided arrangement may be utilized wherein both the drive and receive coils may be disposed on both sides (i.e., the two opposite sides of the currency paper). A double-sided coil arrangement generally places greater separation between the drive and receive coils 120, 124, thereby minimizing stray capacitive coupling of the magnetic fields. Also, a double-sided coil arrangement generally yields a resulting magnetic field strength from the response magnetic field generated by the magnetic metal regions 140 of the security thread 108 that is less sensitive to the spatial positioning of the document 104 within the gap between the receive coil 124. Alternatively, the drive coil 120 may be located on one side of the paper 104, while the receive coil 124 may be located on the other side of the paper.

Also, FIGS. 4–6 illustrate the drive/receive coil arrangement as being disposed at an angle of, e.g., 45° with respect to the long dimension of the security thread within the currency paper. Again, this is purely exemplary. Such an angular relationship allows the security thread 108 to have each of its magnetic regions 140 interrogated one at a time by the drive/receive coil arrangement. However, this 45° angular relationship also allows the applied magnetic field to be oriented in a partially perpendicular direction to the thread.

Figure 7:
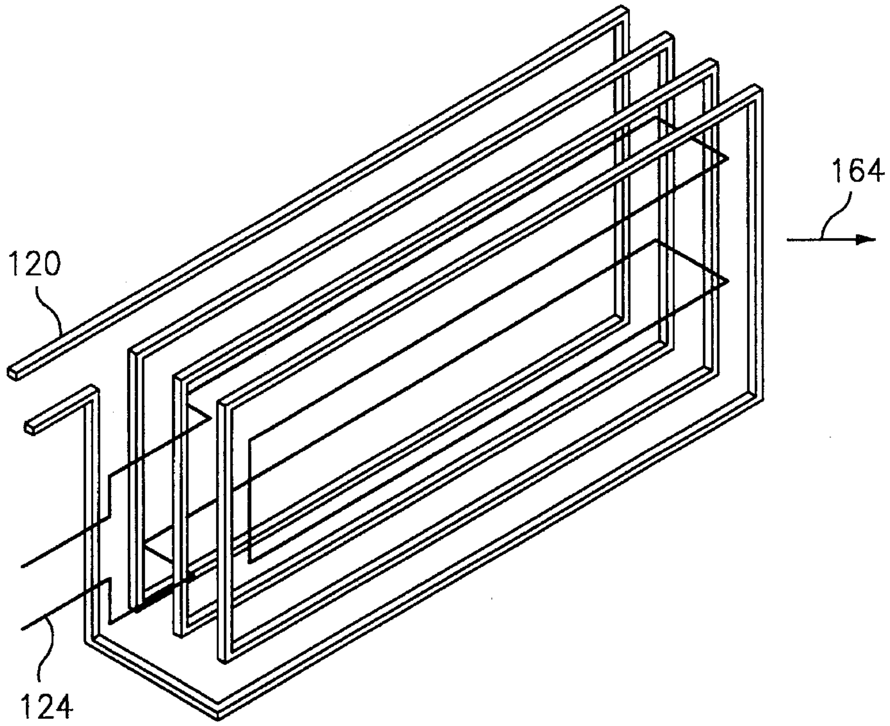
FIG. 7 is an alternative arrangement of a drive coil and a receive coil.

Referring now to FIG. 7, there illustrated is a double-sided, air-core arrangement of the drive and receive coils 120, 124. This arrangement provides a highly uniform applied magnetic field to the security thread 108 of the proffered currency paper 104. In general, the strength and direction of the applied magnetic field has a strong influence on the relative amplitudes of any resulting harmonic signals within the response magnetic field generated by the magnetic regions 140 of the security thread 108. Thus, the applied magnetic field is generally required to be relatively uniform across any spatial position in which the currency paper 104 may be positioned. For example, the applied magnetic field should be relatively uniform across any detection head gap in which the currency paper may experience some flutter due to the mechanics of the transport device (not shown) utilized to move the currency paper relative to the drive and receive coils 120, 124. Further, as can be seen from FIG. 7, the major planes of the drive and receive coils 120, 124 are at right angles. This eliminates any direct coupling of magnetic fields between the coils.

The arrowhead 164 in FIG. 7 illustrates the direction of travel of the currency paper with respect to the coils 120, 124. Although not shown in FIG. 7, in an exemplary embodiment the currency paper 104 is directed with respect to the coils 120, 124 such that the wide dimension or edge 168 of the paper (FIG. 4) is the leading dimension of travel. Also, although not shown in FIG. 7, the security thread 108 is oriented at a 45° angle with respect to the long dimension of the drive and receive coils 120, 124. This is for the same reasons as given hereinbefore with respect to the ferrite core 156 and coil arrangement. Further, and most importantly with respect to reading the spatial distribution of the magnetic regions 140 of the security thread 108, the narrow dimension of the receive coil 124 of FIG. 7 (i.e., the distance between the two parallel wire portions of either the upper or lower part of the single-turn receive coil) is shorter than the shortest length of any magnetic region 140 of the security thread 108. This allows individual and discrete magnetic field signals to be acquired from the receive coil, wherein each acquired signal contains information on some magnetic characteristic of only one corresponding magnetic metal region 140. The resulting information is utilized in determining a specific characteristic of the document 104 as indicated by the spatial distribution of the magnetic regions 140 on the security thread substrate 112. For example, when the document 104 is a currency or banknote paper, the characteristic determined is denomination. Denomination determination is described in more detail hereinafter.

Figure 8:
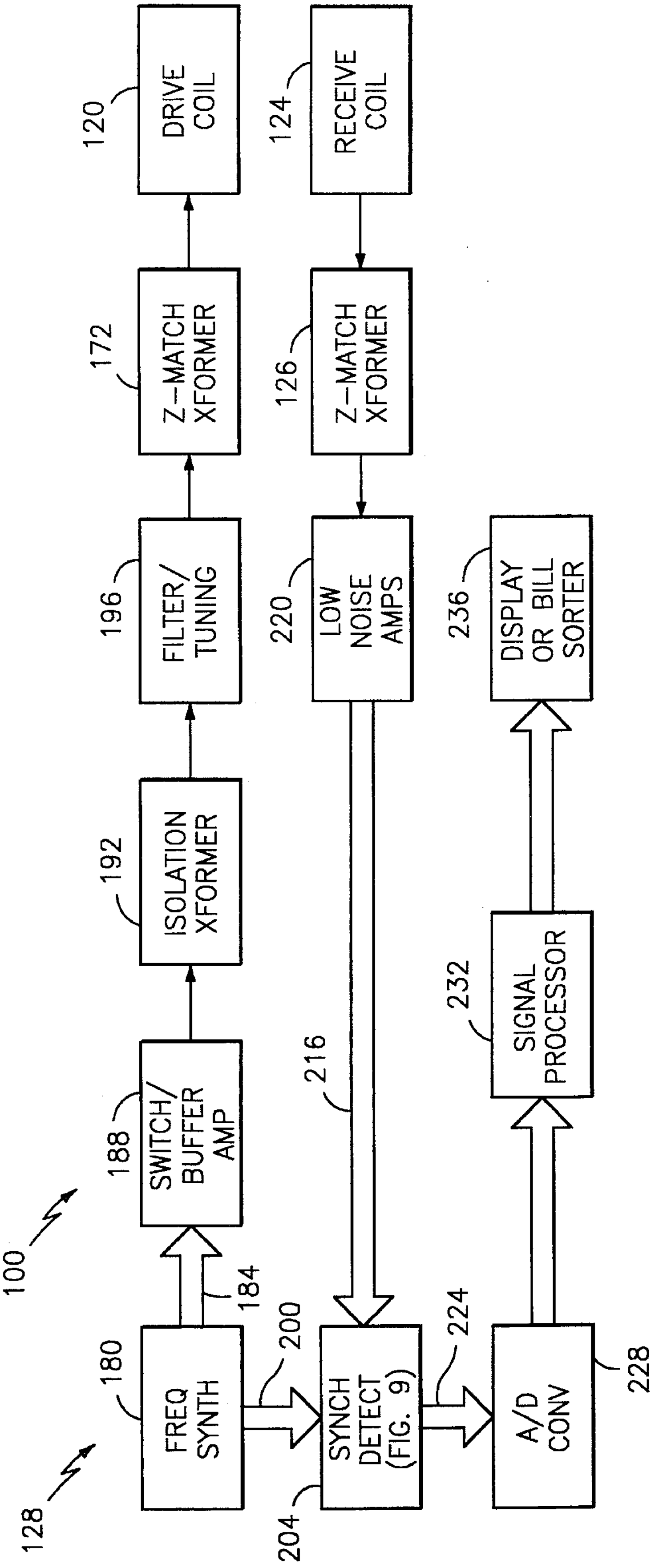
FIG. 8 is a schematic block diagram of electronic circuitry connected with both the drive coil and the receive coil of FIGS. 4–7.

Referring now to FIG. 8, there illustrated is a schematic block diagram of electronic circuitry 128 that interfaces with the various drive/receive coil arrangements contemplated, some of which are described hereinbefore in FIGS. 4–7. Both the drive coil 120 and the receive coil 124 have corresponding impedance-matching transformers 172, 176 that reduce the effects of capacitive coupling relative to inductive coupling. Also, the impedance matching transformer 172 used in conjunction with the drive coil 120 can reduce the voltage fed to the drive coil. Further, although not shown, the receive coil 120 may have a capacitor connected in conjunction therewith in order to create a resonant circuit. The use of the resonant circuit improves the signal-to-noise ratio and ratio of tuned-frequency to non-tuned frequency rejection in the detection of this single harmonic frequency. However, if the electronic circuitry 128 is utilized to detect more than one harmonic frequency, the resonant circuit is less applicable and the capacitor is generally not utilized.

The electronic circuitry 128 also includes a frequency synthesizer 180 that generates various signals at certain frequencies. The frequency synthesizer 180 provides a pair of alternating current (AC) signals on a signal bus 184 to a switching and buffer amplifier stage 188. The frequency synthesizer 180 may comprise individual components arranged in a well-known manner to generate the signals provided to the amplifier 188. On the other hand, frequency synthesizer 180 may, if desired, comprise a digital application specific integrated circuit (ASIC).

The two drive signals provided by the frequency synthesizer 180 are described in detail hereinafter. These two signals are amplified in the amplifier stage 188 and fed to an isolation transformer 192 and then to a filter and tuning block 196. The filter may comprise a LC band pass filter that allows only frequencies within a certain range to be fed to the impedance matching transformer 172 and then to the drive coil 120 in order to reduce the amount of harmonics in the signal waveform fed to the drive coil 120.

Figure 9:
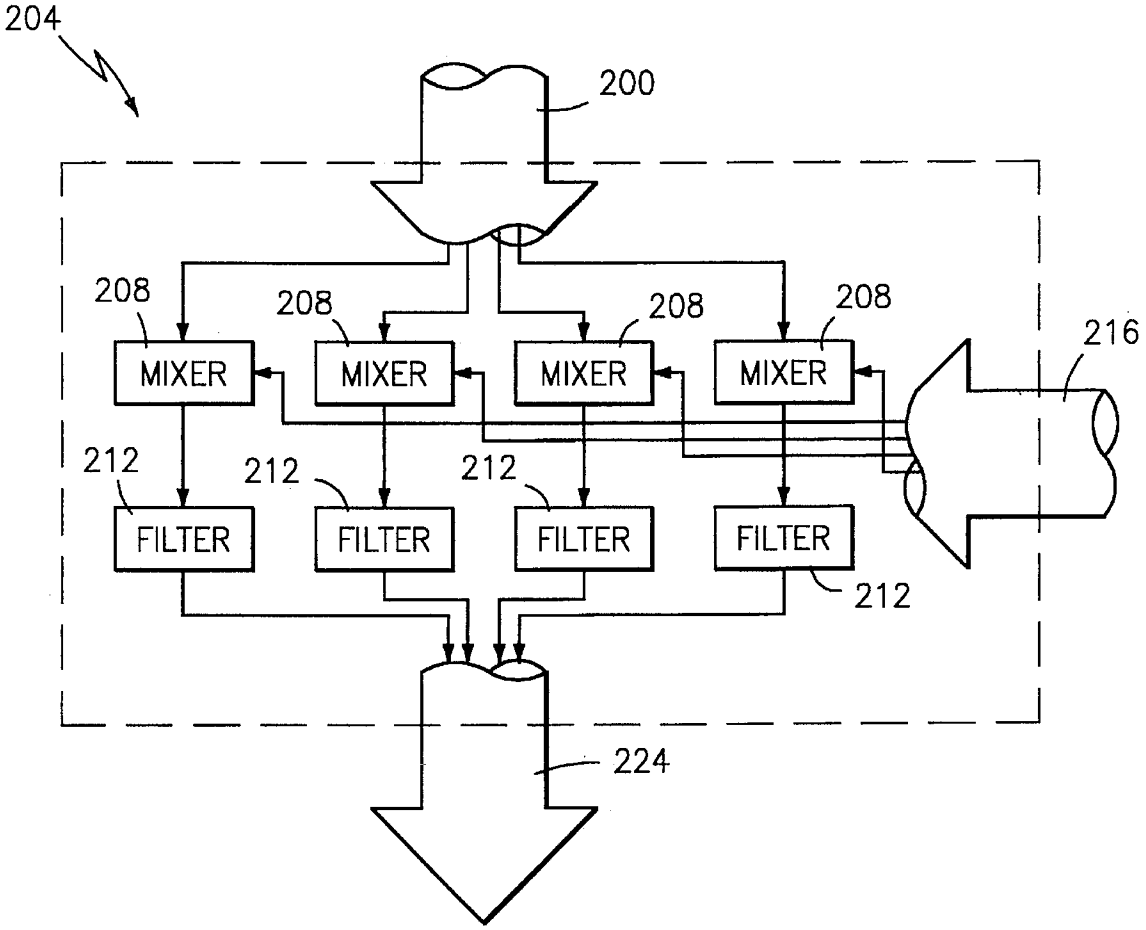
FIG. 9 is a more detailed schematic diagram of one of the block diagram components of FIG. 8.

The frequency synthesizer also provides a plurality of signals on a signal bus 200 to a synchronous detector stage 204. The synchronous detector stage 204, illustrated in greater detail in FIG. 9, contains a plurality (e.g., 4) of identical signal mixers 208 and 4-pole low-pass active filters 212. Each mixer may comprise the Model DG411, commercially available. In an exemplary embodiment, the frequency synthesizer 180 provides a first signal on the bus 200 that is an AC signal at a frequency of 40 kHz. A second signal on the bus 200 is also at the frequency of 40 kHz, but is phase-shifted 90° (i.e., is in a "quadrature" phase relationship) with respect to the "fundamental" in-phase signal provided to the first mixer 208. The frequency synthesizer 180 also provides a signal at 120 kHz that has the same phase relationship as the fundamental signal. This third signal is at a frequency that is three times that of the fundamental signal, and is also "in-phase" with the 40 kHz fundamental signal. Finally, the frequency synthesizer 180 provides the fourth signal that is also at 120 kHz, and is in a quadrature phase relationship to the 120 kHz "in-phase" signal. These four signals from the frequency synthesizer 180 on the bus 200 are provided to corresponding mixer 208 and filter 212 stages within the synchronous detector 204.

Also provided to each mixer 208 as a separate input is a corresponding signal on a signal bus 216 connected with a plurality of corresponding low noise amplifiers 220. Each amplifier may comprise the Model AD826, commercially available. Also included within the low noise amplifier stage 220 are corresponding high impedance low noise amplifiers, which each may comprise the Model AD797. Connected to the input of these amplifiers 220 are the signals from the receive coil 124 passed through the corresponding impedance matching transformer 176.

Each mixer 208 within the synchronous detector 204 is operable to extract the signal information magnetically sensed by the receive coil 124 from the frequency of the applied signal to the drive coil 120 using a known demodulation scheme. The individual outputs from the four mixer stages 208 are then provided on individual signal lines that comprise the signal bus 224 that is connected with an analog-to-digital converter 228. The digitized output from the analog-to-digital converter is fed to a signal processor 232, which may comprise a known microprocessor circuit. The signal processor, as described in detail hereinafter, functions to determine the validity of the document passed in proximity to the drive coil 120 and a receive coil 124 from the data, if any, "read" from the magnetic metal regions 140 of the security thread 108. Finally, the signal output from the signal processor 232 may be provided to, e.g., a display device or a currency sorter 236 or other types of "host" systems.

In operation, the frequency synthesizer 180 provides the two signals on the bus 184 to the amplifier stage 188. These signals are AC signals, each at 40 kHz and are square wave signals. A first square wave signal has a leading phase shift angle of +120° with respect to the 40 kHz in-phase signal provided by the frequency synthesizer 180 to the synchronous detector 204. The second square wave signal at 40 kHz provided to the amplifier stage 188 is at a lagging phase angle of −120° with respect to the 40 kHz in-phase signal provided by the synthesizer 180 to the synchronous detector 204. Although purely exemplary, the use of these two square-wave signals, 120° out-of-phase, provides for reduced cost of components utilized within the electronic circuitry 128 without affecting performance. Since a normal square wave contains a plurality of components at the third harmonic frequency, the chance of undesirable stray coupling of such harmonics from the drive coil 120 to the receive coil 124 is eliminated by combining the two signals to obtain a pseudo square-wave signal applied to the drive coil 120 without any third harmonic content.

The 40 kHz square-wave signal is applied to the drive coil 120 to create an alternating current applied magnetic field that is highly uniform due to the physical construction of the drive coil 120, described hereinbefore with respect to exemplary embodiments of FIGS. 4–7. The frequency of the drive signals applied to the drive coil 120 is at an exemplary value of 40 kHz. However, preferably, the frequency is in the range of between 500 hz and 500 kHz and, most preferably in the range of 10 kHz to 100 kHz. At lower frequencies, the signal amplitude is low, so available electronic signal-to-noise content is one constraint of the frequency. The frequency must also be sufficiently high such that each resolved magnetic metal region 140 of the security thread 108 is measured during at least a few cycles of the applied magnetic field. For example, for high-speed currency sorters utilized in banks, a typical feed speed of 10 meters per second dictates a frequency of at least 10 kHz, and preferably around 40–50 kHz. On the other hand, as the drive frequency is increased, the apparent magnetic material coercivity tends to increase for most materials. The apparent coercivity should be sufficiently low that the magnetic material is driven into saturation by the applied magnetic field. Otherwise, the desired high degree of non-linearity in the response magnetic field will not occur. The coercivity and drive magnetic fields must be reasonably low in magnitude to maintain sufficient distinction from common magnetic materials, such as house keys. In the preferred embodiment described herein, the apparent coercivity of the magnetic material regions 140 is between 500 and 750 amperes per meter, and the drive field amplitude is approximately 1000 amperes per meter.

In operation, as the proffered currency paper 104 with the security thread 108 therein is passed in non-contacting proximity to the drive coil 120 and the receive coil 124 (preferably at a distance of less than ten (10) millimeters), the applied alternating current magnetic field at the frequency of 40 kHz saturates the magnetic metal regions 140 of the security thread. These magnetic metal regions 140 then re-emit a response magnetic field that, because the regions 140 are saturated by the applied magnetic field, contains various frequency components. That is, the response magnetic field generated by the magnetic metal regions 140 contain a fundamental component at the fundamental frequency of 40 kHz. The response magnetic field also contains various frequency components at harmonics or multiples of the fundamental frequency. The electronic circuitry 128 of the present invention is designed, in a preferred embodiment, to sense the third harmonic frequency (i.e., 120 kHz) of the fundamental frequency of 40 kHz. The third harmonic represents a relatively low order harmonic and it is preferred since lower-order harmonics usually generate more signal energy then do higher-order harmonics. Also, odd numbered harmonics are preferred as they are preferentially generated over even numbered harmonics in the absence of any significant direct current (DC) magnetic field. However, it should be understood that any harmonic may be utilized in a device 100 similar to that of the present invention. However, utilizing the third harmonic, as in the preferred embodiment described herein, provides for a significant signal-to-noise advantage over usage of relatively higher-order harmonics.

The various frequency components of the response magnetic field generated by the magnetic metal regions 140 of the security thread 108 are detected by the receive coil 124 and are ultimately provided to the synchronous detector stage 204. The amplitude or magnitude of each of the four previously described signals are demodulated by the synchronous detector and digitized by the analog-to-digital converter 228 and provided to the signal processor 232. These four signals consist of the in-phase and quadrature signals at the fundamental frequency of 40 kHz, together with the in-phase and quadrature signals at the third harmonic frequency of 120 kHz. The signal processor functions to determine, in accordance with one aspect of the device 100 of the present invention, the type of magnetic material 116 comprising the magnetic material regions 140 of the security thread 108. In an exemplary embodiment, the signal processor 232 determines the type of magnetic material regions 140 by comparing the amplitude of the third harmonic signal of the fundamental frequency to a certain threshold level stored in memory associated with the signal processor 232. The amplitude of the in-phase component of the third harmonic signal of the fundamental frequency indicates a valid magnetic material 116 utilized in the magnetic metal regions 140 when the amplitude of that signal is above a certain threshold, which is a known value that corresponds to the type of magnetic material 116. This ensures that a highly non-linear magnetic material 116 is present on the security thread 108.

The second component of the test comprises a comparison of the amplitude of the in-phase fundamental frequency component to a predetermined threshold. Again, the threshold is known and unique to the type of magnetic material 116 utilized. A valid condition exists when the amplitude of that fundamental frequency component is below a certain threshold level. This test insures that no excessive amount of magnetic material is present on the surface of the security thread in an attempt to forge the non-linearity characteristic in a counterfeit currency paper 104. A third test carried out by the signal processor 232 is a comparison of the ratio of the amplitudes of the in-phase third harmonic component with the amplitude of the in-phase fundamental frequency to a range of values stored in the memory associated with the signal processor 232. This test insures that the appropriate degree of non-linear to linear behavior is present. Most common magnetic materials utilized by counterfeiters will have a very low level ratio under this third test. On the other hand, genuine "soft" magnetic material 116 utilized for the magnetic metal regions 140 of the security thread 108 will generate a higher level ratio under this test. The ratio is typically decided by trial and error using specific measuring equipment and depends on the specific magnetic materials used and their amount and configuration.

The signal processor may then indicate the results of these tests by providing the appropriate information to the display or bill sorter 236. As a further test of the validity of the type of magnetic material 116 utilized in the magnetic metal regions 140 of the security thread 108, a device 100 of the present invention may utilize the amplitude of the quadrature signal components of either the fundamental frequency component or the third harmonic component to estimate the magnetic coercivity of the material 116. Specifically, the signal processor 232 may take the arctangent of the ratio of the amplitude of the quadrature component to the in-phase component at either the fundamental frequency or the third harmonic frequency. The resulting computed value for the arctangent of that ratio can be compared to expected values for various types of magnetic materials 116. A low coercivity magnetic material will have a relatively low amount of phase shift as indicated by the quadrature component. On the other hand, a high coercivity magnetic material 116 will have a relatively high phase shift as indicated by the quadrature component. In a similar manner, the results of this comparison may be provided by the signal processor 232 to the display or bill sorter 236, or any other type of device to indicate a "pass/fail" condition of the proffered currency paper 104.

Besides verifying the validity of the proffered currency paper 104 by verifying the type of magnetic material 116 utilized as the magnetic metal regions 140 of the security thread, the device 100 of the present invention can also determine a characteristic of the document 104. For example, if the document 104 is a currency or banknote paper, the denomination of the currency paper may be determined in an attempt to distinguish between different types of documents within a general class of documents. The device 100 of the present invention is operable to distinguish between these types of documents by sensing the spatial distribution of the magnetic material 116 of the security thread 108. This is accomplished, in part, through the usage of a drive coil 120 and a receive coil 124 that provide for relatively strong and highly uniform applied magnetic fields. Also, the receive coil 124, because of its physical dimensions, can sense the response magnetic field from the magnetic metal regions 140 in a highly localized pattern.

As described in detail hereinbefore with respect to FIGS. 4–7, the receive coil 124 has a distance between the two parallel wires of the coil that is smaller than the length of the smallest magnetic metal region 140 on the security thread. For use with a security thread with generally rectangular magnetic metal regions 140 (as in FIG. 1), it is preferred that the drive magnetic field be applied as much as possible in a perpendicular direction to the height dimension of the indicia 136 of the thread. In this way, the magnetic drive field is applied to each magnetic metal region 140 in a quasi-independent manner. This yields a more easily separable, high-contrast pattern "signature" in the resulting signals processed by the signal processor 232. If, instead, the applied magnetic field runs parallel to the length of the security thread, then the applied magnetic field covers more than one magnetic metal region, providing for magnetic field coupling between the regions 140. This causes a "blurring" of the signal pattern to some extent. Thus, as described hereinbefore, the applied magnetic field is at a 45° angle, which results in interrogation of one region 140 at a time, but also allows the applied magnetic field to run partially perpendicular to the regions 140.

Therefore, as an alternative to the 45° arrangement illustrated in FIG. 4, the drive coil 120 and receive coil 124 arrangement may be orientated with respect to the currency paper 104 such that the wide edge 168 of the paper is the leading edge in the direction of scanning of the paper with respect to the coils 120, 124. In that situation, the long dimension of the coils 120, 124 are both oriented perpendicular with respect to the long dimension of the thread 108.

Regardless of the drive coil 120 and receive coil 124 configuration utilized, the device 100 of the present invention operates to sense the denomination of the currency paper 104 by sensing the type of magnetic material 116 utilized within each region 140 of the security thread 108. The signal processor 232 may then utilize the data collected for each magnetic metal region 140 in a number of different ways to determine the denomination of the currency paper 104. For example, the signal processor 232 may take the time-average of some or all of the data associated with each magnetic metal region. This data for each region may be that described hereinbefore that is determined by the three-part test to determine the type of magnetic material 116 present in the region 140. In the alternative, the signal processor 232 may look at the peaks in the amplitudes of the demodulated signals and use that data in a determination of the denomination. A third alternative would be that the first occurrence of a fixed amount of data above a certain threshold level may be utilized. Once denomination has been determined, by whatever method chosen, this denomination may serve as an indication also of the validity of the currency paper 104.

In another preferred embodiment, a spatial pattern matching technique is utilized by the signal processor 232 to determine the denomination of the proffered currency paper 104. The method utilized by the signal processor 232 is to compare the resulting data (i.e., the demodulated in-phase and quadrature signals for both the fundamental and/or the third harmonic component) with stored signal "templates". It is also possible to combine the two (i.e., the in-phase and quadrature components) to obtain an overall amplitude at each frequency used in the comparison. These templates represent an expected signal corresponding to an appropriate portion to each of various possible denomination patterns within a group of security papers 104. If the denomination pattern repeats several times within a single proffered currency paper, then the template may be for a single repeat cycle, or even for any number of repeat cycles. To aid in distinguishing between templates, each template has two associated numbers (i.e., the template threshold and template normalization factor) which is chosen by a process of trial and error.

The signal processor 232 may accomplish denomination determination utilizing a process implemented in software. Initially, the signal processor may extract a subset of the detected signal for the same physical length of the pattern of magnetic material on the security thread as represented by the template. That is, the length of the pattern is determined from a fixed time length given a known, fixed velocity of the currency paper passing in proximity to the drive and receive coils 120, 124. Instead, if the currency paper velocity is not fixed (e.g., the currency paper is "hand-swiped" with respect to the coils 120, 124), then a velocity measurement and velocity compensation via linearization are required, for example, from interruption of the edge of the currency paper is determined by one or more optical sensors (not shown).

The extracted signal subset is then scaled by the signal processor 232 so that its average amplitude matches that of the template. The template is then substrated from the scaled extracted signal substrate, and the squares of the resulting waveform values are summed and divided by the number of points to obtain an error "score" for this extracted subset against the template. A smaller error score indicates a closer match. The signal processor 232 then obtains a similar error score for every possible subset of the detected signal against each of the templates, and retains only the minimum error score achieved for each template (i.e., the "template error scores"). This process of testing every possible set can be regarded as sliding the template along the full length of the measured signal to look for a match.

The signal processor then subtracts each of the template error scores from the appropriate template threshold and scales the result by the template normalization factor. If none of the resulting scores is greater than zero, no match is reported. Otherwise, a match is reported for the template against which the signal achieved the largest score. To further increase the level of discrimination or ability of the signal processor 232 to distinguish between various denominations of the currency, several (e.g., 3) templates of different lengths can be used for each denomination. The average template score for the three templates is used in selecting the final matched denomination. The three templates differ, for example, in that they represent spatially shifted elements of the pattern. Alternately, they can represent degrees of physical stretch of the pattern feature. Choice of the set of templates depends on the anticipated types of in-use or in-manufacture distortion of the physical pattern on the feature.

It should be understood by those skilled in the art that obvious modifications can be made without departing from the spirit of the invention. Accordingly, reference should be made primarily to the accompanying claims, rather than the foregoing specification, to determine the scope of the invention.

Having thus described the invention, what is claimed is:

1. A device for verifying the authenticity of a document having a security thread associated therewith, the security thread including one or more regions of magnetic material, each region of magnetic material having one or more predetermined linear and non-linear ferromagnetic characteristics including a coercivity of no greater than 5000 amperes per meter and a relative permeability of between 200 and 10,000, the device comprising:

a. drive means for providing an applied magnetic field as an alternating current magnetic field at a predetermined fundamental frequency within a predetermined spatial region through which the document is passed, the drive means comprises means for providing the applied magnetic field to saturate at least one of the one or more regions of magnetic material;

b. receive means for sensing a response magnetic field within the predetermined spatial region through which the document is passed at a distance of no greater than ten millimeters from a magnetic field sensing portion of the receive means, and for providing one or more sensed signals indicative of a corresponding one or more characteristics of the response magnetic field, wherein the response magnetic field is an alternating current magnetic field, and wherein in the presence of the security thread within the predetermined spatial region the response magnetic field is at the predetermined fundamental frequency of the applied magnetic field and at one or more harmonic frequencies of the predetermined fundamental frequency; and c. signal processing means, responsive to the sensed signals for determining at least one of the one or more predetermined linear and non-linear ferromagnetic characteristics of each region of magnetic material to verify the authenticity of the document.

2. The device of claim 1, wherein the one or more predetermined linear and non-linear ferromagnetic characteristics of at least one of the one or more regions of magnetic material includes a type of the magnetic material.

3. The device of claim 2, wherein the one or more sensed signals are indicative of the predetermined fundamental frequency and the one or more harmonic frequencies of the predetermined fundamental frequency, and wherein the signal processing means comprises means for determining the type of magnetic material in response to the one or more sensed signals.

4. The device of claim 3, wherein the signal processing means comprises means for determining the type of magnetic material by comparing the sensed signal indicative of the third harmonic frequency to a first predetermined threshold, by comparing the sensed signal indicative of the fundamental frequency to a second predetermined threshold, and by comparing the ratio of the sensed signal indicative of the third harmonic frequency and sensed signal indicative of the fundamental frequency to a predetermined range of values therefore.

5. The device of claim 1, wherein the receive means comprises means for providing at least one of the sensed signals as an actual phase signal indicative of a phase of the response magnetic field with respect to the applied magnetic field at the predetermined fundamental frequency.

6. The device of claim 5, wherein the signal processing means comprises means for determining the type of magnetic material by comparing the actual phase signal to a reference phase signal, wherein the actual phase signal is indicative of a magnetic coercivity of the magnetic material and wherein the reference signal is indicative of an expected value of the magnetic coercivity of the magnetic material.

7. The device of claim 1, wherein the receive means comprises means for providing, for each one of the one or more regions of magnetic material, at least one of the one or more sensed signals, the signal processing means comprising means, responsive to the sensed signals for determining a characteristic of the document therefrom to determine the authenticity of the document.

8. The device of claim 7, wherein the characteristic of the document is a denomination of the document.

9. The device of claim 8, wherein the signal processing means comprises means for determining the denomination of the document by comparing the sensed signals to one or more stored signals indicative of a desired-denomination of the document.

10. The device of claim 2, wherein the predetermined fundamental frequency is in a frequency range of between 500 hertz and 500 kilohertz.

11. The device of claim 1, wherein the drive means comprises a first wire coil, and wherein the receive means comprises a second wire coil.

12. The device of claim 11, wherein the second wire coil has a width that is less than a length of any one of the one or more regions of magnetic material of the security thread.

13. The device of claim 11, wherein the first wire coil and the second wire coil are both spatially positioned on one side of the document.

14. The device of claim 11, wherein the first wire coil and the second wire coil are both spatially positioned on both sides of the document.

15. The device of claim 11, wherein the first wire coil is wound on a core.

16. The device of claim 15, wherein the core is a ferrite material.

17. The device of claim 11, wherein the first wire coil and the second wire coil are spatially positioned on opposite sides of the document.

* * * * *